United States Patent [19]

Murakami et al.

[11] Patent Number: 4,691,223
[45] Date of Patent: Sep. 1, 1987

[54] SEMICONDUCTOR DEVICE HAVING HIGH BREAKDOWN VOLTAGE

[75] Inventors: Susumu Murakami, Katsuta; Teruyuki Kagami, Hitachiota; Tsutomu Yatsuo; Masaaki Takahashi, both of Hitachi, all of Japan

[73] Assignee: Hitachi, Ltd., Tokyo, Japan

[21] Appl. No.: 795,464

[22] Filed: Nov. 6, 1985

[30] Foreign Application Priority Data

Nov. 9, 1984 [JP] Japan ................................ 59-234989

[51] Int. Cl.4 ............................................ H01L 27/02
[52] U.S. Cl. ...................................... 357/51; 357/34; 357/37; 357/38; 357/51
[58] Field of Search .................. 357/51, 59 F, 34, 37, 357/38

[56] References Cited

U.S. PATENT DOCUMENTS

| 3,890,698 | 6/1975 | Clark | 357/59 |
| 4,001,762 | 1/1977 | Aoki et al. | 357/59 |
| 4,270,137 | 5/1981 | Coe | 357/59 |

Primary Examiner—Edward J. Wojciechowicz
Attorney, Agent, or Firm—Antonelli, Terry & Wands

[57] ABSTRACT

A semiconductor device includes a semiconductor substrate having at least three semiconductor layers of alternately different conductivity types between a pair of principal surfaces. A pair of main electrodes are kept in low-resistance contact with the outermost ones of the semiconductor layers. A surface-passivation insulating film is provided on an exposed surface of the semiconductor substrate. A resistive material sheet is provided on the insulating film and connected electrically to semiconductor layers having their potentials substantially equal to the main electrodes.

27 Claims, 25 Drawing Figures

F I G. 2 a
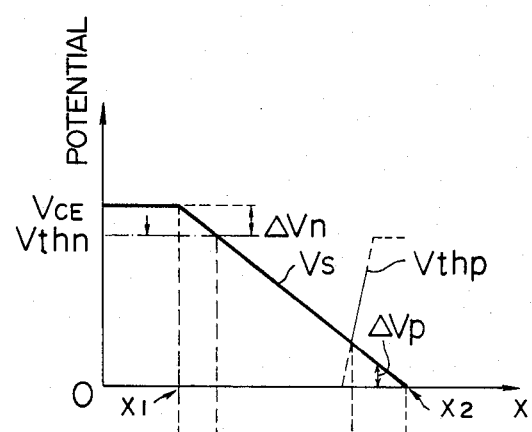
F I G. 2 b
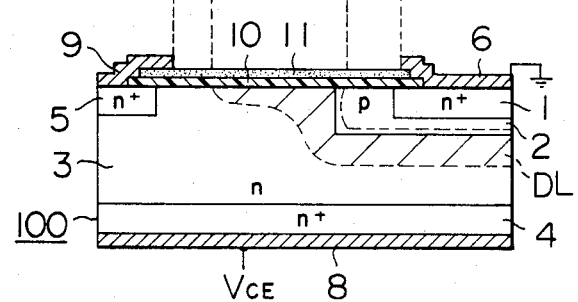

SEMICONDUCTOR DEVICE HAVING HIGH BREAKDOWN VOLTAGE

BACKGROUND OF THE INVENTION

The present invention relates to a semiconductor device, and more particularly to a surface passivation film structure for improving the breakdown voltage and the reliability of a semiconductor substrate which includes at least a three-layer transistor structure of npn or pnp.

Various methods have been used for improving the breakdown voltage of a semiconductor device. For example, a method has hitherto been known in which, as disclosed in Japanese Patent Publication No. 52-24833, an insulating film is provided on an exposed end of a pn junction formed in a semiconductor substrate, and a resistive material film is deposited on the insulating film at a place between a pair of electrodes kept in contact with p- and n-semiconductor layers. Further, a similar method is disclosed in F. A. Selim, "High-Voltage, Large-Area Planar Devices", IEEE Electron Device Letters, Vol. EDL-2, No. 9, 1981, pages 219 to 221. In this method, in order to enhance the breakdown voltage of a semiconductor substrate having a two-layer diode structure of pn, a resistive material sheet is provided in the same manner as disclosed in the above-referred Japanese patent publication, and a semi-insulating (namely, highly-resistive) polycrystalline silicon film (hereinafter referred to as SIPOS) is used as the resistive material sheet.

However, the above techniques have been applied to a diode having a single pn junction, and have not solved the problem of the emitter-collector breakdown voltage of an npn or pnp transistor structure. In more detail, when the above techniques are applied to the collector and base layers of a transistor, the collector-base breakdown voltage is improved. However, according to the inventors' experiments, the emitter-collector breakdown voltage becomes lower, as compared with a case where the SIPOS is not provided.

SUMMARY OF THE INVENTION

An object of the present invention is to provide a semiconductor device which has a high breakdown voltage and is highly reliable.

Another object of the present invention is to provide a semiconductor device in which the breakdown voltages of two pn junctions included in a semiconductor substrate are both improved.

According to the present invention, there is provided a semiconductor device in which a semiconductor substrate includes at least three semiconductor layers sandwiched between a pair of principal surfaces so that adjacent ones of the semiconductor layers are different in conductivity type from each other, a pair of main electrodes are kept in low-resistance contact with outermost ones of the semiconductor layers, a surface-passivation insulating film is provided on an exposed surface of the semiconductor substrate, and a resistive material sheet is provided on the insulating film and connected electrically to semiconductor layers each having substantially the same potential with a corresponding one of the main electrodes.

BRIEF DESCRIPTION OF THE DRAWINGS

FIG. 1b is a sectional view taken along line Ib—Ib of FIG. 1a;

FIG. 1c is a sectional view taken along line Ic—Ic of FIG. 1a;

FIG. 2a is a graph for explaining the operation of the transistor of FIGS. 1a to 1c;

FIG. 2b is a sectional view showing a main part of the transistor of FIGS. 1a to 1c;

FIG. 8b is a sectional view taken along line VIIIb—VIIIb of FIG. 8a;

FIG. 9b is a sectional view taken along line IXb—IXb of FIG. 9a;

FIG. 9c is a sectional view taken along line IXc—IXc of FIG. 9a;

FIG. 10b is a sectional view taken along line Xb—Xb of FIG. 10a;

FIG. 10c is a sectional view taken along line Xc—Xc of FIG. 10a;

FIG. 11b is a sectional view taken along line XIb—XIb of FIG. 11a;

FIG. 11c is a sectional view taken along line XIc—XIc of FIG. 11a;

DESCRIPTION OF THE PREFERRED EMBODIMENTS

The first embodiment of the present invention will now be explained with reference to FIGS. 1a to 1c.

Figure 1A:
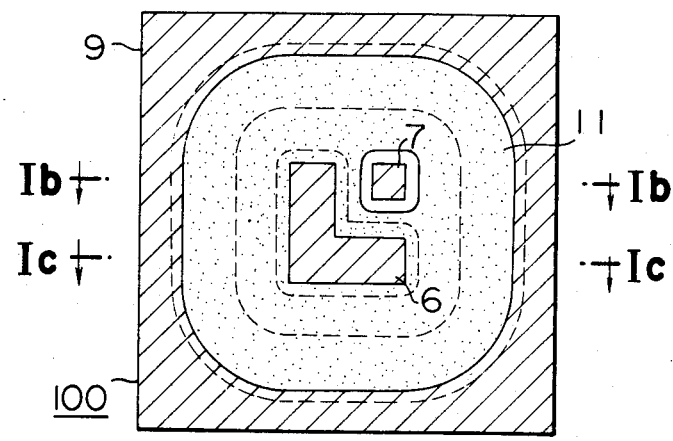
FIG. 1a is a top view showing the emitter side of a transistor which is a first embodiment of the present invention.
Figure 1B:
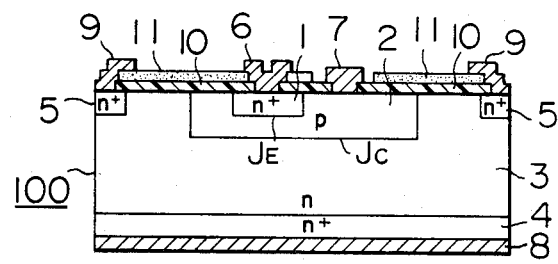
Figure 1C:
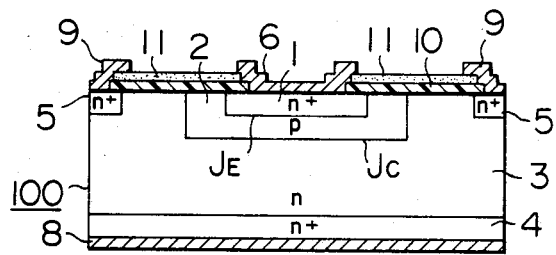

Referring to FIGS. 1a to 1c, a semiconductor substrate 100 for forming an npn transistor includes an n+-emitter layer 1, a p-base layer 2, a highly-resistive, n-collector layer 3, and n+-collector layer 4 and an n+-channel cut layer 5 which are sandwiched between upper and lower principal surfaces of the substrate 100. In the p-base 2, the impurity concentration is highest at the surface thereof, and decreases as the depth from the surface is larger. Respective end portions of a collector junction $J_c$ and an emitter junction $J_E$ are exposed to the upper principal surface of the substrate 100 to form a planar structure. Further, in FIGS. 1a to 1c, reference numeral 6 designates an emitter electrode kept in contact with n+-emitter layer 1, 7 a base electrode kept in contact with the p-base layer 2, 8 a collector electrode kept in contact with the n+-collector layer, 9 a channel cut electrode kept in contact with the n+-channel cut layer 5, 10 an insulating film such as an $SiO_2$ film, a phosphosilicate glass film, or an $Si_3N_4$ film, and 11 a highly-resistive, oxygen-containing amorphous silicon film provided on the insulating film 10. As shown in FIGS. 1b and 1c, the oxygen-containing amorphous silicon film (hereinafter referred to as "OCAS") 11 is connected to the n+-emitter layer 1 and the highly-resistive, n-collector layer 3 through the emitter electrode 6 and the channel cut electrode 9. However, as shown in FIGS. 1a and 1b, the OCAS 11 does not contact with the base electrode 7. As is apparent from FIGS. 1b and 1c, the OCAS 11 is provided on the exposed end portions of the emitter and collector junctions $J_E$ and $J_C$ through the insulating film 10. Incidentally, in FIG. 1a showing the emitter side of the first embodiment, the electrodes 6, 7 and 9 are indicated by hatched areas, and the OCAS 11 is indicated by an area peppered with splashes.

The operation of the transistor having the above structure will be explained below, with reference to FIGS. 2a and 2b. FIG. 2b shows a main part of the transistor of FIGS. 1a to 1c, and FIG. 2a shows the potential distribution at the main part of FIG. 2b. Explanation of the same reference symbols as in FIGS. 1a to 1c will be omitted for brevity's sake.

First, explanation will be made of the reason why the base-collector breakdown voltage $BV_{CBO}$ of the transistor of FIGS. 1a to 1c is improved. When an emitter-collector voltage $V_{CE}$ is applied between the emitter electrode 6 and the collector electrode 8 while keeping the emitter electrode 6 at a ground potential, a leakage current flows through the OCAS 11. Thus, when the positions of the emitter electrode 6 and the channel cut electrode 9 are expressed by $x_2$ and $x_1$, respectively, a potential $V_s$ of the OCAS 11 at a position x between the emitter electrode 6 and the channel cut electrode 9 can be approximated by the following equation:

$$V_s = V_{CE}\left(1 - \frac{x - x_1}{x_2 - x_1}\right) \quad (1)$$

where $x > x_1$.

Now, let us express threshold voltages at which strong inversion occurs on the surfaces of the n-collector layer 3 and the p-base layer 2 by the distributed potential of the OCAS 11, by and $V_{thn}$ and $V_{thp}$, respectively. Owing to the presence of the OCAS 11, an effective voltage $\Delta V_n$ applied to the surface of the n-collector layer 3 is equal to $(V_s - V_{CE})$, which is negative. A surface portion of the n-collector layer 3 where the absolute value of $\Delta V_n$ is greater than the absolute value of the threshold voltage $V_{thn}$, is converted into a depletion layer. In a case where the OCAS 11 is not provided, the potential $V_s$ of the OCAS 11 is not present, and hence the surface of the n-collector layer 3 is converted in a depletion layer only by the emitter-collector voltage $V_{CE}$. That is, when the OCAS 11 is provided, a depletion layer DL in the surface of the n-collector layer 3 is extended, and hence the electric field intensity in the surface of the n-collector layer 3 is reduced. Thus, the surface of the layer 3 can withstand a high base-collector voltage.

While, owing to the potential distribution at the OCAS 11, an effective voltage $\Delta V_p$ applied to the surface of the p-base layer 2 is approximately equal to $V_s$ (which is positive), when the built-in voltage $V_{bi}$ of the pn junction formed between the n+-emitter layer 1 and the p-base layer 2 is neglected. A surface portion of the p-base layer 2 where the effective voltage $\Delta V_p$ is greater than the threshold voltage $V_{thp}$, is converted into a depletion layer. Now, let us consider a case where the p-base layer 2 is formed by diffusion, by way of example. The p-base layer 2 has the highest impurity concentration at a position where a dopant is selectively deposited, and the impurity concentration decreases as the distance from the above position in an inward or lateral direction is larger. For example, let us suppose that the impurity concentration varies in accordance with the Gaussian distribution. Then, the impurity concentration $N(y,t)$ is given by the following equation:

$$N(y,t) = \frac{Q_0}{\sqrt{\pi D t}} \exp\left(-\frac{y^2}{4Dt}\right) \quad (2)$$

where $Q_0$ indicates the total quentity of the dopant deposited on the substrate surface at the above position, D a diffusion constant, and y the distance from the above position.

Further, the threshold voltage $V_{thp}$ is a function of the impurity concentration, and is approximately expressed by the following equation:

$$V_{thp} = V_{FB} + 2\phi_{FP} + \frac{\sqrt{2\epsilon_s\epsilon_0 q N_A(2\phi_{FP})}}{C_0} \quad (3)$$

where $V_{FB}$ indicates a flat band voltage, $\phi_{FP}$ a Fermi potential, $\epsilon_s$ the relative dielectric constant of silicon, $\epsilon_0$ the dielectric constant of vacuum, q the electronic charge, $N_A$ the impurity concentration at the surface of the p-base layer 2, and $C_0$ the capacitance per unit area of the insulating film 10 underlying the OCAS 11. As indicated by a dotted line in FIG. 2a, the threshold voltage $V_{thp}$ is large at a surface portion having a high impurity concentration.

It is to be noted that a surface portion of the p-base layer 2 where $V_{thp} > V_s$, is kept at an accumulation, and is not affected by the potential $V_s$ of the OCAS 11. Hence, the above surface portion is remained as a neutral region even when the emitter-collector voltage $V_{CE}$ is applied. Accordingly, if the p-base layer 2 includes a surface portion having a high impurity concentration, the present npn transistor will not be subjected to punch-through breakdown. For example, let us consider a case where the impurity concentration $N_A$ at the surface of the p-base layer 2 is equal to $1 \times 10^{19}$ atoms/cm$^3$, the insulating film 10 is made of $SiO_2$ and has a thickness of 1.5 µm, and the flat band voltage $V_{FB}$ is nearly equal to zero. In this case, the threshold voltage $V_{thp}$ is approximately equal to 1,100 V, and hence the p-base layer 2 is not readily inverted. As is evident from the above explanation, the OCAS 11 can improve the base-collector breakdown voltage $V_{CBO}$.

Next, explanation will be made of the reason why the base-collector breakdown voltage is improved.

The emitter-collector breakdown voltage $BV_{CEO}$ is affected by the transistor action, and hence is given by the following formula:

$$BV_{CEO} \simeq \frac{BV_{CBO}}{\sqrt[n]{h_{FE} + 1}} \quad (4)$$

where n is a constant in a range from 2 to 5, and $h_{FE}$ indicates a common-emitter current gain.

Figure 3:
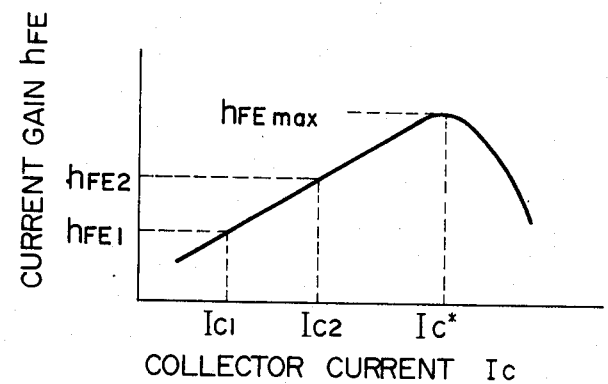
FIG. 3 is a graph for explaining the operation of the transistor of FIGS. 1a to 1c.

The current gain $h_{FE}$ varies with the collector current $I_C$ as shown in FIG. 3. That is, the current gain $h_{FE}$ is small for a small collector current, increases with increasing collector current, and reaches a maximum value $h_{FEmad}$ at a collector current $I_C^*$.

The collector current $I_{C1}$ of the transistor of FIGS. 1a to 1c is given by the following equation:

$$I_{C1} = (1 + h_{FE1})I_{CBO1} + I_{S1} \quad (5)$$

ps where $I_{CBO1}$ indicates a leakage current at the base-collector junction, and $I_{S1}$ a leakage current flowing through the OCAS 11.

Figure 4:
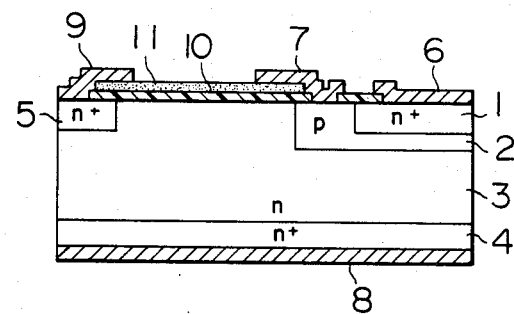
FIG. 4 is a sectional view showing a main part of a transistor of the prior art.

FIG. 4 shows a transistor according to the prior art. In this prior art transistor, an SIPOS 11 is provided so as to bridge the pn junction formed between the p-base layer 2 and the n-collector layer 3, through the base electrode 7 and the channel cut electrode 9. Incidentally, in FIG. 4, the same reference numerals as in FIGS. 1a to 1c designate identical or equivalent parts. When the leakage current at the base-collector junction and the leakage current flowing through the SIPOS 11 are expressed by $I_{CBO2}$ and $I_{S2}$, respectively, the collector current $I_{C2}$ of the prior art transistor of FIG. 4 is given by the following equation:

$$I_{C2} = (1 + h_{FE2})I_{CBO2} + h_{FE2}I_{S2} \quad (6)$$

When the leakage currents $I_{CBO1}$ and $I_{S1}$ in the equation (5) are equal to the leakage currents $I_{CBO2}$ and $I_{S1}$ in the equation (6), respectively, it can be supposed that the collector current $I_{C2}$ is greater than the collector current $I_{C1}$, since the leakage current $I_{S2}$ acts as a base current in the prior art transistor.

Next, it will be confirmed that the collector current $I_{C2}$ is greater than the collector current $I_{C1}$.

Let us form the following equations:

$$I_{C2} = I_{C1} + \Delta I_C \quad (7)$$

$$h_{FE2} = h_{FE1} + \Delta h_{FE} \quad (8)$$

and check whether or not a term $\Delta h_{FE}$ takes such a state as shown in FIG. 3. From the equations (5) to (8), the term $\Delta h_{FE}$ is given by the following equation:

$$\Delta h_{FE} = \frac{\Delta I_C + I_{S1}(1 - h_{FE1})}{I_{CBO1} + I_{S1}} > 0 \quad (9)$$

Since a current gain $h_{FE}$ is smaller than 1 (one), the equation (9) shows that the term $\Delta h_{FE}$ is positive. Accordingly, the supposition that the collector current $I_{C2}$ is greater than the collector current $I_{C1}$, is correct, and the current gain $h_{FE2}$ is undoubtedly greater than the current gain $h_{FE1}$.

By substituting the current gains $h_{FE1}$ and $h_{FE2}$ in the equation (4), we can obtain the following equations:

$$BV_{CEO1} = \frac{BV_{CBO1}}{\sqrt[n]{h_{FE1} + 1}} \quad (10)$$

$$BV_{CEO2} = \frac{BV_{CBO2}}{\sqrt[n]{h_{FE2} + 1}} \quad (11)$$

When the breakdown voltage $BV_{CBO1}$ is equal to the breakdown voltage $BV_{CBO2}$, the breakdown voltage $BV_{CEO1}$ is greater the breakdown voltage $BV_{CEO2}$. That is, according to the present invention, not only the collector-base breakdown voltage $BV_{CBO}$ but also the collector-emitter breakdown voltage $BV_{CEO}$ can be improved.

As mentioned above, in the prior art transistor of FIG. 4 in which the leakage current $I_S$ flowing through the SIPOS 11 acts as the base current causing the transistor action, owing to the presence of the SIPOS 11, the base-collector breakdown voltage $BV_{CBO}$ is enhenced, but the emitter-collector breakdown voltage $BV_{CEO}$ is lowered. On the other hand, according to the present invention, the OCAS 11 does not contact with the base electrode 7 as shown in FIGS. 1a and 1b but is connected directly to the emitter electrode 6 and the channel cut electrode 9. Accordingly, the leakage current $I_S$ flowing through the OCAS 11 does not cause the transistor action, and thus a reduction in emitter-collector breakdown voltage due to the OCAS 11 does not occur.

Figure 5A:
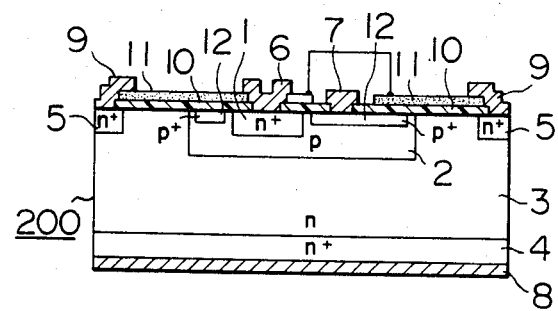
FIG. 5a is a sectional view showing another transistor which is a second embodiment of the present invention, and corresponding to the sectional view of FIG. 1b.
Figure 5B:
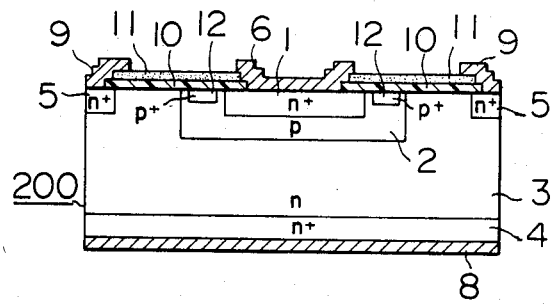
FIG. 5b is a sectional view showing the second embodiment of FIG. 5a and corresponding to the sectional view of FIG. 1c.

FIGS. 5a and 5b show, in section, another transistor which is the second embodiment of the present invention. In FIGS. 5a and 5b, reference numerals 1 to 11 designate the same parts as in FIGS. 1a to 1c. The transistor of FIGS. 5a and 5b is characterized in that a highly-doped p+-layer 12 is formed selectivelY in the surface of the p-base layer 2 of a semiconductor substrate 200. Usually, the p-base layer 2 is formed by selective diffusion techniques. Accordingly, the p-base layer 2 has a high impurity concentration at the surface thereof, and the impurity concentration decreases as the distance from the surface in the inward direction is larger. In some cases, however, it is preferable to make low the impurity concentration of the p-base layer 2 for the purpose of enhancing the emitter-base breakdown voltage and improving switching characteristics of transistor. In more detail, when the impurity concentration of that portion of the p-base layer 2 which is kept in contact with the insulating film 10 and exists in close proximity to the emitter-base junction, is made low, the emitter-base breakdown voltage $BV_{EBO}$ is enhanced. Further, when the impurity concentration of that portion of the p-base layer 2 which exists just beneath the $n^+$-emitter layer 1, is made low, the current gain $h_{FE}$ for large values of collector current $I_C$ increases, and thus the switching characteristics of transistor are improved. However, in order to prevent punch-through breakdown in an npn transistor, it is required to make high the impurity concentration at the surface of the p-base layer 2. In view of the above facts, in the transistor of FIGS. 5a and 5b, the impurity concentration of the p-base layer 2 is made low, and the $p^+$-layer 12 is formed only in a portion of the surface of the p-base layer 2. Thus, the base-collector breakdown voltage $BV_{CBO}$ is further improved, and hence the advantage of the present invention is emphasized.

Figure 6A:
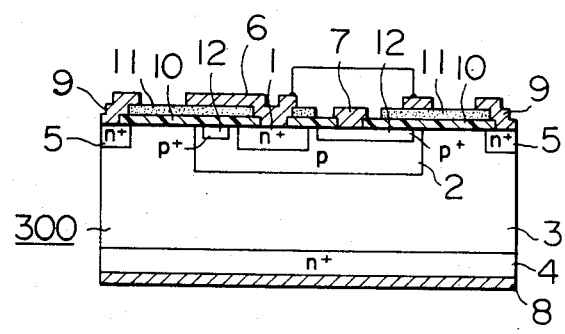
FIG. 6a is a sectional view showing a further transistor which is the third embodiment of the present invention, and corresponding to the sectional view of FIG. 1b.
Figure 6B:
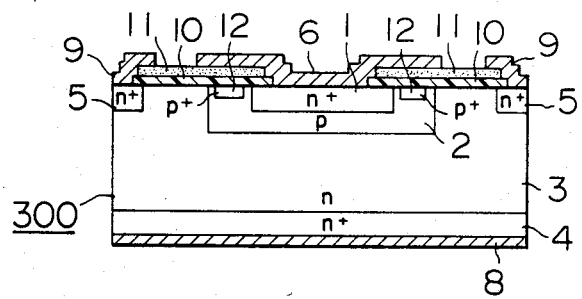
FIG. 6b is a sectional view showing the third embodiment of FIG. 6a and corresponding to the sectional view of FIG. 1c.

FIGS. 6a and 6b show a further transistor which is the third embodiment of the present invention and is a modified version of the second embodiment of FIGS. 5a and 5b, and correspond to FIGS. 5a and 5b, respectively. In FIGS. 6a and 6b, the same reference numerals as in FIGS. 5a and 5b designate like parts. The transistor of the FIGS. 6a and 6b different from that of FIGS. 5a and 5b, in that the emitter electrode 6 on a semiconductor substrate 300 is extended toward the channel cut electrode 9 over that portion of the pn junction formed between the p-base layer 2 and the n-collector layer 3 which is kept in contact with the insulating film 10, and thus the whole of the above pn junction is covered with the emitter electrode 6. Accordingly, when an emitter-collector voltage $V_{CE}$ is applied between the electrodes 6 and 8, a voltage applied across the pn junction formed between the $n^+$-emitter layer 1 and the p-base layer 2 is in the order of a built-in voltage $V_{bi}$ of the emitter-base junction, and no voltage is applied to the surface of the p-base layer 2 by the OCAS 11. Accordingly, the inversion or depletion layer which has been explained with reference to FIG. 2a, is not formed in the surface of the p-base layer 2, and thus it is presented that the breakdown voltage of the npn transistor is lowered by the punch-through phenomena at the p-base layer 2. Basically, the $p^+$-layer 12 of FIGS. 6a and 6b is not always required, but can further improve the breakdown voltage and the reliability of the transistor.

Next, it will be explained on the basis of the result of experiments made by the inventors that the present invention is effective for improving the emitter-collector breakdown voltage $BV_{CEO}$.

Figure 7:
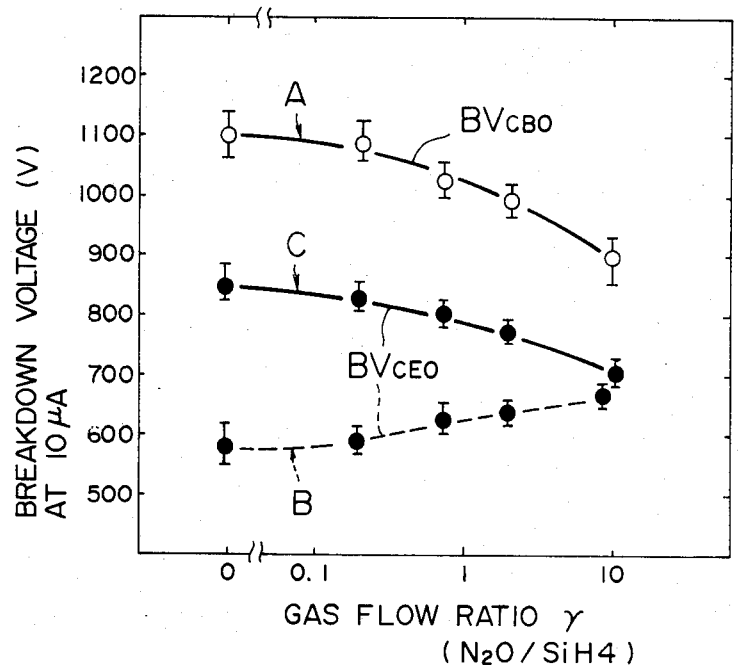
FIG. 7 is a graph showing relations between gas flow ratio $\gamma$ for forming a resistive amorphous silicon film and the breakdown voltage of each of the conventional transistor of FIG. 4 and the inventive transistor of FIGS. 6a and 6b.

FIG. 7 shows the emitter-collector breakdown voltage $BV_{CEO}$ and base-collector breakdown voltage of transistor having the inventive structure of FIGS. 6A and 6B, and the above breakdown voltages of transistors having the conventional structure of FIG. 4. The OCAS 11 in the inventive structure was formed in the following manner. A semiconductor substrate was placed on a susceptor which was mounted in a bell jar, at atmospheric pressure. Thereafter, the OCAS was grown on the substrate of 650° C. by the chemical vapor decomposition using the reaction of nitrous oxide ($N_2O$) and monosilane ($SiH_4$). The breakdown voltages $BV_{CBO}$ and $BV_{CEO}$ of the above transistor varied with the gas flow ratio (namely, $\gamma = N_2O/SiH_4$) as shown in FIG. 7. Incidentally, the resistivity of the n-collector 3 was made equal to 36 $\Omega$·cm in both the prior art structure of FIG. 4 and the inventive structure of FIGS. 6a and 6b. Referring to FIG. 7, the transistor having the prior art structure and the transistors having the inventive structure have the same base-collector breakdown voltages $BV_{CBO}$ indicated by a curve A. In the transistors having the prior art structure, however, when the content ratio $\gamma$ of reactant gases is small, the resistance of the SIPOS 11 decreases, and the leakage current $I_S$ flowing through the SIPOS 11 increases. Thus, the emitter-collector breakdown voltage $BV_{CEO}$ is greatly reduced by the transistor action due to the leakage current $I_S$, as indicated by a curve B. The above fact has been already explained in detail, using the equations (4) and (6) and FIG. 4, and hence further explanation thereof will be omitted.

While, in the transistors having the inventive structure, as indicated by a curve C of FIG. 7, the emitter-collector breakdown voltage $BV_{CEO}$ is not reduced by the leakage current $I_S$ but is determined only by the semiconductor substrate itself, and a ratio of the emitter-collector breakdown voltage $V_{CEO}$ to the base-collector breakdown voltage $V_{CBO}$ is nearly equal to 0.8 for each value of gas flow ratio $\gamma$. That is, according to the present invention, the base-collector breakdown voltage $BV_{CBO}$ and the emitter-collector breakdown voltage are both improved.

Next, explanation will be made of thyristors according to the present invention.

Figure 8A:
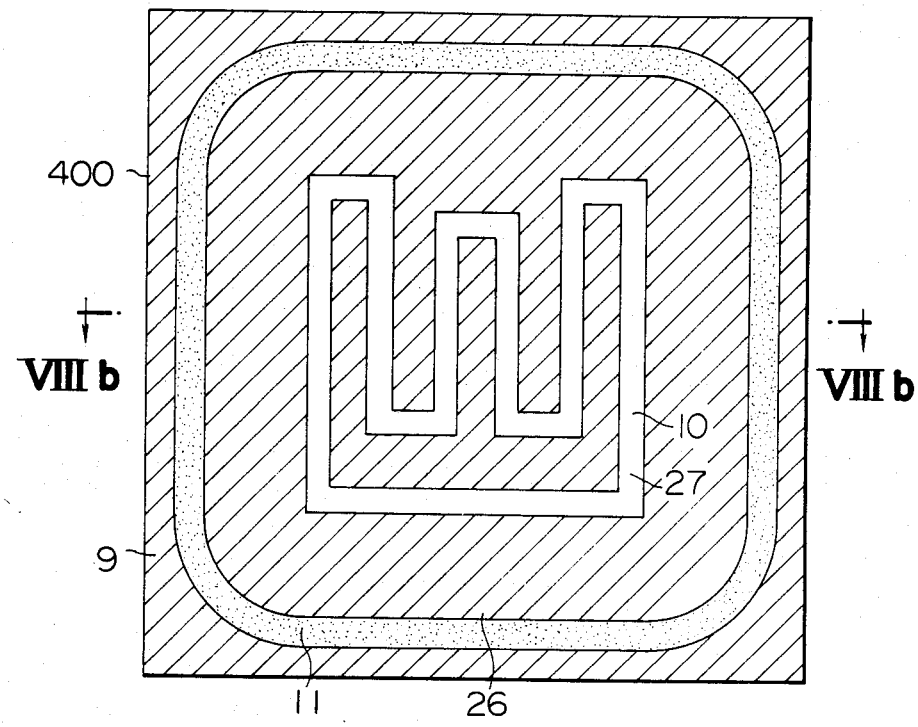
FIG. 8a is a top view of a gate turn-off thyristor which has a shorted emitter structure on the anode side and is a fourth embodiment of the present invention.
Figure 8B:
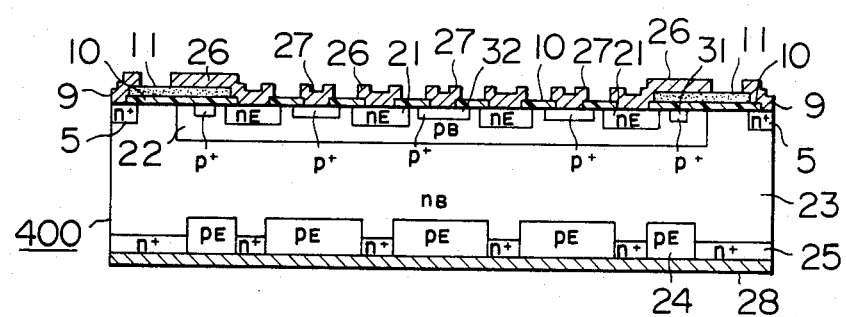

FIGS. 8a and 8b show a gate turn-off thyristor which is the fourth embodiment of the present invention. Referring to FIGS. 8a and 8b, a semiconductor substrate 400 has a four-layer structure of pnpn, and includes an $n^+$-emitter layer 21 having the form of the teeth of comb, a p-base layer 22, an n-base layer 23, a p-emitter layer 24, an $n^+$-shorting layer 25, and a $p^+$-layer 32. A cathode electrode 26 and a gate electrode 27 are provided on the $n^+$-emitter layer 21 and the p-base layer 22, respectively, and an anode electrode 28 is provided on the p-emitter layer 24 and the $n^+$-shorting layer 25. Other reference numerals than the above-mentioned designate the same parts as in FIGS. 1a to 1c. The OCAS 11 is connected through the channel cut electrode 9 to the n-base layer 23, which has substantially the same potential with the p-emitter layer 24 and the anode electrode 28 through the $n^+$-shorting layer 25.

Now, explanation will be made of the operation of the thyristor of FIGS. 8a and 8b in a blocking state.

An anode volta $V_{AK}$ is applied between the anode electrode 28 and the cathode electrode 26 so that the electrode 28 is at a positive potential with respect to the electrode 26, while keeping the gate electrode 27 at an open state. The $n^+$-shorting layer 25, the n-base layer 23 and the $n^+$-channel cut layer 5 make up an $n^+ n\ n^+$ structure, that is, a three-layer structure of the same conductivity type. In a blocking state, that is, in a state that minority carriers are prevented from being injected from the $n^+$-emitter layer 21 and the p-emitter layer 24 into the p-base layer 22 and the n-base layer 23, respectively, the layer 25, 23 and 5 of the above $n^+ n\ n^+$ structure have the same potential. In other words, the anode electrode 28 has the same potential with the channel cut electrode 9, and hence the anode voltage $V_{AK}$ is considered to be applied between the channel cut electrode 9 and the cathode electrode 26. When such an anode voltage is applied to the thyristor, the leakage current $I_S$ pasing through the OCAS 11 flows through the cathode electrode 26 and the channel cut electrode 9, but does not flow through the gate electrode 27. Accordingly, an npn transistor portion made up the $n^+$-emitter layer 21, the p-base layer 22 and the n-base layer 23 is not operated by the leakage current $I_S$. Accordingly, as has been explained in detail for the transistor of FIGS.

1a to 1c, a reduction in breakdown voltage due to the npn transistor action does not occur in the thyristor of FIGS. 8a and 8b. Further, even when an abruptly varying voltage (namely, a voltage having a large value of dV/dt) is applied between the cathode electrode 26 and the anode electrode 28, the erroneous triggering will not take place, since the leakage current $I_S$ flows directly into the cathode electrode 26. A gate signal which is applied between the cathode electrode 26 and the gate electrode 28 to turn on or off the thyristor, does not pass through the OCAS 11. Accordingly, the turn-on and turn-off characteristics of the thyristor is never deteriorated by the OCAS 11.

Figure 9A:
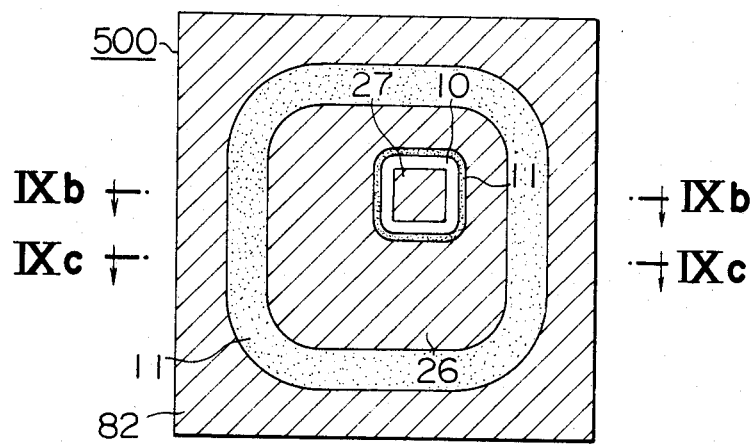
FIG. 9a is a top view of a uni-surface type thyristor which is a fifth embodiment of the present invention.
Figure 9B:
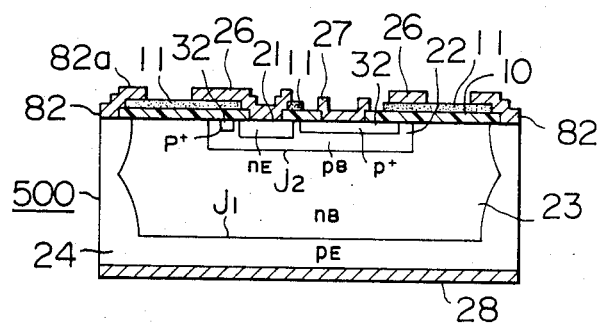
Figure 9C:
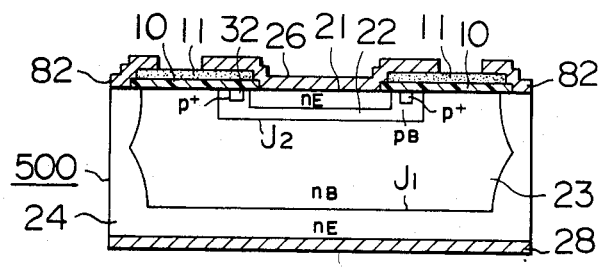

FIGS. 9a to 9c show a uni-surface type thyristor which is the fifth embodiment of the present invention.

Referring to FIGS. 9a to 9c, the p-emitter layer 24 is also exposed to the surface of a semiconductor substrate 500 on the cathode side, and a second anode electrode 82 which is provided on the exposed surface of the p-emitter layer 24 on the cathode side, is connected to the OCAS 11. Other reference numerals designate the same parts as in FIGS. 8a and 8b.

Now, the operation of the thyristor of FIGS. 9a to 9c will be explained below.

When an anode voltage $V_{AK1}$ is applied between the anode electrode 28 and the cathode electrode 26 so that the electrode 28 is at a positive potential with respect to the electrode 26, while keeping the gate electrode 27 at an open state, that is, the thyristor is put into a forward blocking state, the anode voltage $V_{AK1}$ is applied to a pn junction $J_2$ formed between the p-base layer 2 and the n-base layer 3, and thus a depletion layer is extended from the pn junction $J_2$ mainly into the n-base layer 23. When an end portion 82a of the second anode electrode 82 is extended toward the cathode electrode 26 over that portion of a pn junction $J_1$ formed between the p-emitter layer 24 and the n-base layer 23 which is exposed to the surface of the substrate 500 on the cathode side, the second anode electrode 82 acts as a field plate, and the above-mentioned depletion layer is not extended across the end portion 82a of the second anode electrode 82. Therefore, the punch through does not occur in a pnp structure made up of the p-base layer 22, the n-base layer 23 and the p-emitter layer 24. Moreover, the OCAS 11 does not contact with the gate electrode 27 but is connected directly to the cathode electrode 26 and the second anode electrode 82, similarly to the structures of FIGS. 1a to 1c and FIGS. 8a to 8b. Accordingly, the OCAS 11 does not cause a transistor action in an npn transistor portion made up of the $n^+$-emitter layer 21, the p-base layer 22 and the n-base layer 23, and hence the npn transistor portion has an ideal breakdown voltage. Further, even when an anode voltage $V_{AK2}$ is applied between the cathode electrode 26 and the anode electrode 28 so that the electrode 26 is at a positive potential with respect to the electrode 28, that is, the thyristor is put into a reverse blocking state, the OCAS 11 according to the present invention can exhibit the same effect as in the forward blocking state. Accordingly, the present invention is applicable to a thyristor having both the forward blocking state and the reverse blocking state.

Figure 10A:
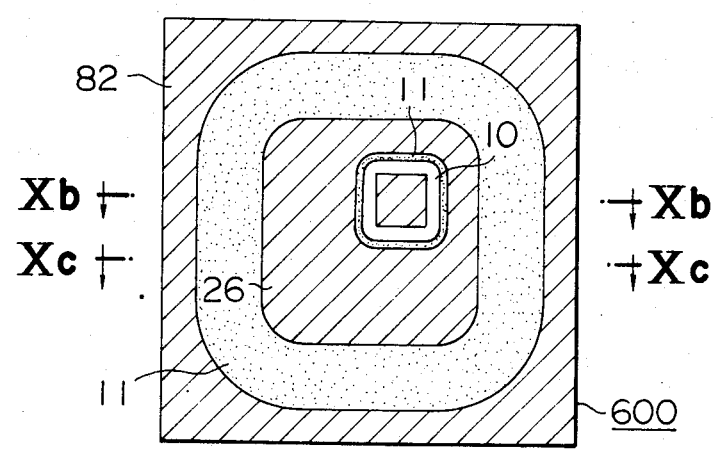
FIG. 10a is a top view of another uni-surface type thyristor which is a sixth embodiment of the present invention and is a modified version of the fifth embodiment of FIGS. 9a to 9c.
Figure 10B:
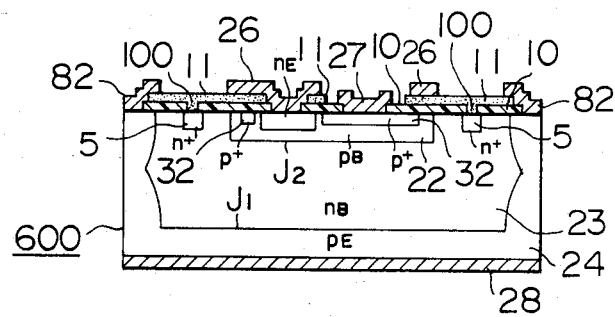
Figure 10C:
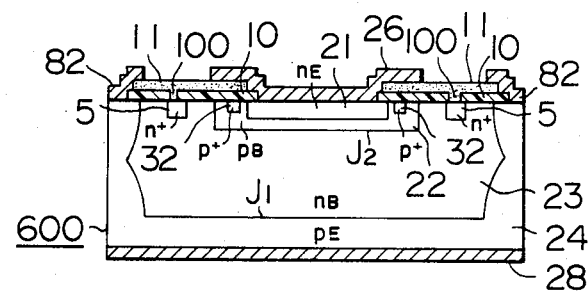

FIGS. 10a to 10c show a thyristor which is a modified version of the thyristor of FIGS. 9a to 9c and is the sixth embodiment of the present invention.

The thyristor of FIGS. 10a to 10c is greatly different from that of FIGS. 9a to 9c, in that the $n^+$-channel cut layer 5 is provided in the surface of the n-base layer 23 at a position spaced apart equally from the pn junctions $J_1$ and $J_2$, and an opening 100 is provided in the insulating film 10 at a position just above the channel cut layer 5. Incidentally, the same reference numerals as in FIGS. 9a to 9c designate like parts.

Now, the operation of the thyristor of FIGS. 10a to 10c will be explained below. First, let us consider a case where the thyristor is put into a forward blocking state, that is, the anode voltage $V_{AK1}$ is applied between the anode electrode 28 and the cathode electrode 26 so that the electrode 28 is at a positive potential with respect to the electrode 26. In this case, the pn junction $J_1$ is applied with a forward bias voltage, and the pn junction $J_2$ is applied with a reverse bias voltage. Further, in a $pnn^+$ structure formed of the p-emitter layer 24, the n-base layer 23 and the $n^+$-channel cut layer 5, a potential difference between the p-emitter layer 24 and the channel cut layer 5 is substantially equal to a built-in voltage of about 0.7 V at the pn junction $J_1$. Accordingly, almost the whole of the anode voltage $V_{AK1}$ is applied across the pn junction $J_2$. In other words, the anode voltage $V_{AK1}$ is applied, as a reverse bias voltage, to a $pnn^+$ diode portion made up of the p-base layer 22, the n-base layer 23 and the $n^+$-channel cut layer 5. Accordingly, that surface portion of the n-base layer 23 which is sandwiched between the p-emitter layer 24 and the $n^+$-channel cut layer 5 is not converted into a depletion layer but exists as a neutral region. When the width of the above surface portion behaving as the neutral region is made large, the current gain of the pnp transistor portion in lateral directions decreases. Accordingly, even when the leakage current $I_S$ flows between the $n^+$-channel cut layer 5 and the $n^+$-emitter layer 21 through the OCAS 11, the breakdown voltage of the thyristor is scarcely lowered by the transistor action of the pnp transistor portion in lateral directions. Further, the thyristor of the FIGS. 10a to 10c can produce the effect of the present invention such as explained previously with reference to FIGS. 1a to 1c. That is, as is apparent from FIGS. 10a and 10b, the leakage current $I_S$ flowing through the OCAS 11 does not pass through the p-base layer 22. Accordingly, a reduction in breakdown voltage of the thyristor due to the transistor action of the npn transistor portion is not accelerated by the leakage current $I_S$. Further, in a case where the anode voltage $V_{AK2}$ is applied between the anode electrode 28 and the cathode electrode 26 so that the electrode 26 is at a positive potential with respect to the electrode 28, that is, the thyristor is put into a reverse blocking state, a reverse bias voltage is applied not to the pn junction $J_2$ but to the pn junction $J_1$, and the thyristor can exhibit the same effect as in the forward blocking state.

Figure 11A:
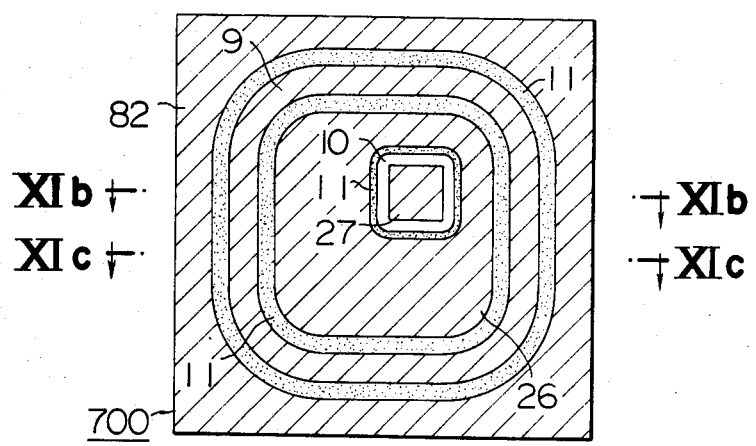
FIG. 11a is a top view of a further uni-surface type thyristor which is a seventh embodiment of the present invention and is a modified version of the sixth embodiment of FIGS. 10a to 10c.
Figure 11B:
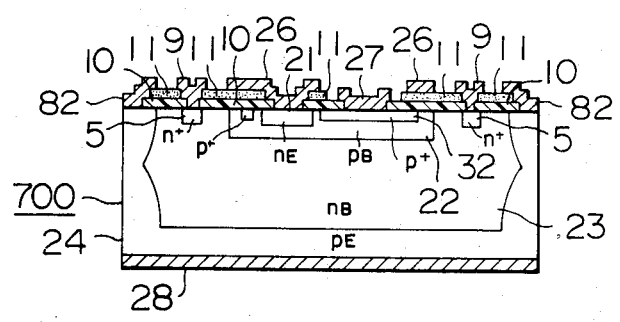
Figure 11C:
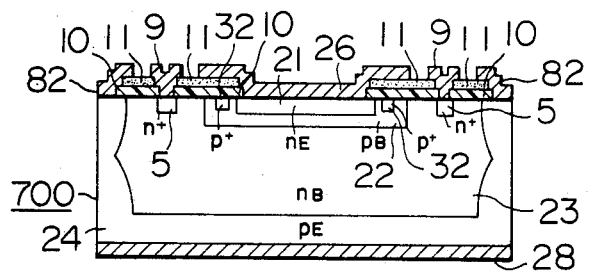

FIGS. 11a to 11c show a thyristor which is a modified version of the sixth embodiment of FIGS. 10a to 10c and is the seventh embodiment of the present invention. The seventh embodiment is different from the sixth embodiment of FIGS. 10a to 10c in the following points. Referring to FIGS. 11a to 11c, the channel cut electrode 9 is provided on a semiconductor substrate 700 so as to be kept in contact with the $n^+$-channel cut layer 5. Further, the channel cut electrode 9 is kept in contact not only with an OCAS 11 from the second anode electrode 82 but also with another OCAS 11 from the cathode electrode 26. The fundamental operation of the seventh embodiment is the same as that of the sixth embodiment having been explained with reference to FIGS. 10a to 10c, and therefore detailed explanation thereof will be omitted. In the seventh embodiment, those end portions of two OCAS's 11 which are both spaced apart substantially equally from the second anode electrode 82 and the cathode electrode 26, have the same potential with the channel cut electrode 5. Further, the seventh embodiment has an advantage that the channel cut electrode 9 can be formed at the same time as the cathode electrode 26, the gate electrode 27 and the second anode electrode 82 are formed.

Figure 12A:
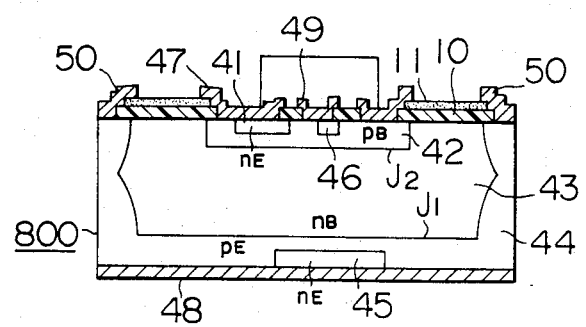
FIG. 12a is a sectional view showing a bidirectional thyristor which is the eighth embodiment of the present invention, and corresponding to the sectional view of FIG. 1b.
Figure 12B:
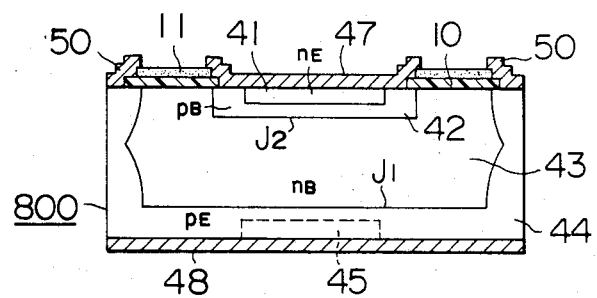
FIG. 12b is a sectional view showing the eighth embodiment of FIG. 12a and corresponding to the sectional view of FIG. 1c.

FIGS. 12a and 12b show a bi-directional thyristor which is fabricated in accordance with the present invention and is the eighth embodiment of the present invention.

Referring to FIGS. 12a and 12b, a semiconductor substrate 800 includes an n+-emitter layer 41, a p-base layer 42, an n-base layer 43, a p-emitter layer 44, a second n+-emitter layer 45, and an auxiliary n+-emitter layer 46. A $T_1$-electrode 47 is provided on the n+-emitter layer 41 and the p-base layer 42; a $T_2$-electrode 48 is provided on the p-emitter layer 44 and the second n+-emitter layer 45, a gate electrode 49 is provided on the p-base layer 42 and the auxiliary n+-emitter layer 46, and a second $T_2$-electrode 50 is provided on that exposed surface of the p-emitter layer 44 which exists on the upper principal surface side of the substrate 800. That portion of the upper principal surface of the substrate 800 which is not provided with the electrodes 47, 49 and 50, is coated with the insulating film 10. Further, the OCAS 11 is provided on that portion of the insulating film 10 which is sandwiched between the $T_1$-electrode 47 and the second $T_1$-electrode 50, in accordance with the present invention.

The bi-directional thyristor of FIGS. 10a and 10b has a uni-surface, center-gate structure, and the pn junctions $J_2$ and $J_1$ block forward and reverse voltages, respectively. The OCAS 11 is provided over the p-base layer 42, the n-base layer 43 and the p-emitter layer 44. Accordingly, when a voltage is applied between the $T_1$-electrode 47 and the $T_2$-electrode 48 so that the $T_1$-electrode is at a positive or negative potential with respect to the $T_2$-electrode, the leakage current $I_S$ flows through the OCAS 11 but does not cause a transistor action which lowers the breakdown voltage of the thyristor. Further, even when an abruptly varying voltage (namely, a voltage having a large value of dV/dt) is applied between the $T_1$-electrode and the $T_2$-electrode, an erroneous triggering will not occur for the same reason as explained previously for the thyristor of FIGS. 8a and 8b.

As has been explained in the foregoing, the present invention is applicable to semiconductor devices having a semiconductor substrate which is provided with a control electrode and includes at least a three-layer structure of pnp or npn, such as a transistor, an ordinary thyristor, a gate turn-off thyristor and a bi-directional thyristor. It is needless to say that the present invention is applicable to semiconductor devices which are opposite in the conductivity type of each semiconductor layer to the embodiments.

In the embodiments, the OCAS 11 is provided on the upper principal surface of the semiconductor substrate. Alternatively, the OCAS 11 may be provided on that side surface of the semiconductor substrate where a pn junction is exposed.

Although, in the embodiments, the OCAS is used as a resistive material film according to the present invention, the SIPOS and other resistive films may be used in place of the OCAS.

In the foregoing, it has been explained that according to the present invention, the breakdown voltage of a semiconductor device can be improved. The inventors carried out a high-temperature, reverse-bias life test, to check the stability of the breakdown voltage, leakage current and current gain. A large change in each of these factors was not found in the above test. Further, the inventors carried out a pressure cooker test and a high-pressure, high-humidity storage test to check the moisture resistance of a semiconductor device according to the present invention. Any change in the characteristics of the semiconductor device was not found in these tests. Thus, it has been confirmed that a semiconductor device according to the present invention is very reliable.

As has been explained in the foregoing, according to the present invention, there is provided a semiconductor device which has a high breakdown voltage and is highly reliable.

We claim:

1. A semiconductor device having a high breakdown voltage, comprising:

a semiconductor substrate having between opposite principal surfaces thereof at least three semiconductor layers which are adjacent to each other with alternately different conductivity types to form pn junctions therebetween, one of the outermost layers of said at least three semiconductor layers being on the side of one of said opposite principal surfaces of said semiconductor substrate, the other outermost semiconductor layer being on the side of the other principal surface, at least predetermined ones of said pn junctions having end portions exposed to said one principal surface of said semiconductor substrate;

a first main electrode provided on said one principal surface in low-resistance contact with one outermost semiconductor layer;

a second main electrode provided on said other principal surface in low-resistance contact with said other outermost semiconductor layer;

a control electrode provided on said one principal surface in low-resistance contact with an intermediate layer of said at least three semiconductor layers adjacent to said one outermost semiconductor layer;

an additional electrode provided on said one principal surface in low-resistance contact therewith, said additional electrode having a potential substantially equal to said other outermost semiconductor layer which is in low-resistance contact with said second main electrode;

a surface-passivation insulating film provided on said one principal surface to cover the exposed end portions of said predetermined ones of said pn junctions for passivation thereof; and a resistive material sheet provided on said surface-passivation insulating film, wherein said resistive material sheet contacts with said first main electrode which is kept in low-resistance contact with said one outermost semiconductor layer, and further wherein said resistive material sheet contacts said additional electrode which has a potential equal to said other outermost semiconductor layer.

2. A semiconductor device according to claim 1, wherein said resistive material sheet is disposed on the exposed end portions of said predetermined ones of said junctions through said surface-passivation insulating film.

3. A semiconductor device according to claim 1, wherein said resistive material sheet includes a semi-insulating, oxygen-containing amorphous silicon layer or a semi-insulating, polycrystalline semiconductor layer.

4. A semiconductor device according to claim 1, wherein said intermediate semiconductor layer adjacent to said one outermost semiconductor layer includes a highly-doped layer in said one principal surface, said control electrode being kept in low-resistance contact with said highly-doped layer.

5. A semiconductor device according to claim 1, wherein said first main electrode extends across the exposed end portions of said predetermined ones of said pn junctions.

6. A semiconductor device according to claim 1, wherein said at least three semiconductor layers are all exposed to said one principal surface.

7. A semiconductor device according to claim 1, wherein said semiconductor substrate has a four-layer structure of pnpn.

8. A semiconductor device according to claim 1, wherein said semiconductor substrate has a four-layer structure of pnpn, said second main electrode being also kept in low-resistance contact with an intermediate semiconductor layer adjacent to said other outermost semiconductor layer.

9. A semiconductor device according to claim 1, wherein said semiconductor substrate has a three-layer structure in which said one outermost semiconductor layer and said intermediate semiconductor layer are exposed to said one principal surface and said other outermost semiconductor layer is exposed to both said one and the other principal surfaces, and wherein all of said pn junctions have the end portions exposed to said one principal surface, said additional electrode being kept in low-resistance contact with that portion of said other outermost semiconductor layer which is exposed to said one principal surface.

10. A semiconductor device according to claim 9, wherein said intermediate semiconductor layer has an impurity concentration which is highest at said one principal surface and decreases with increased depth from said one principal surface.

11. A semiconductor device according to claim 9, wherein said intermediate semiconductor layer includes a higher-doped region in said one principal surface, said control electrode being kept in low-resistance contact with said highly-doped region.

12. A semiconductor device according to claim 9, wherein said first main electrode extends toward said additional electrode on said resistive material sheet beyond the exposed end portion of the pn junction formed between said intermediate semiconductor layer and said other outermost semiconductor layer.

13. A semiconductor device according to claim 1, wherein said semiconductor substrate has a four-layer structure in which said one outermost semiconductor layer, said intermediate semiconductor layer adjacent to said one outermost semiconductor layer, and an intermediate semiconductor layer adjacent to said other outermost semiconductor layer are exposed to said one principal surface and said other outermost semiconductor layer is exposed to both said one and said other principal surfaces, and wherein all of said pn junctions have the end portions exposed to said one principal surface, said additional electrode being kept in low-resistance contact with that portion of said other outermost semiconductor layer which is exposed to said one principal surface.

14. A semiconductor device according to claim 13, wherein said intermediate semiconductor layer adjacent to said one outermost semiconductor layer includes a highly-doped region in said one principal surface, said control electrode being kept in low-resistance contact with said highly-doped region.

15. A semiconductor device according to claim 13, wherein said first main electrode extends toward said additional electrode on said resistive material sheet beyond the exposed end portion of the pn junction formed between said intermediate semiconductor layer adjacent to said one outermost semiconductor layer and said intermediate semiconductor layer adjacent to said other outermost semiconductor layer.

16. A semiconductor device according to claim 13, wherein said additional electrode extends toward said first main electrode on said resistive material sheet beyond the exposed end portion of the pn junction formed between said other outermost semiconductor layer and said intermediate semiconductor layer adjacent to said other outermost semiconductor layer.

17. A semiconductor device according to claim 13, wherein said intermediate layer adjacent to said other outermost semiconductor layer includes a highly-doped region in said one principal surface between the exposed end portion of the pn junction formed between said intermediate semiconductor layer adjacent to said one outermost semiconductor layer and said intermediate semiconductor layer adjacent to said other outermost semiconductor layer and the exposed end portion of the pn junction formed between said other outermost semiconductor layer and said intermediate semiconductor layer adjacent to said other outermost semiconductor layer, said resistive material sheet contacting with said highly-doped region through an opening which is provided in said surface-passivation insulating film.

18. A semiconductor device according to claim 13, wherein said resistive material sheet includes a first resistive material sheet contacting with said first main electrode and a second resistive material sheet contacting with said additional electrode, said intermediate semiconductor laye includes a highly-doped region in said one principal surface between the exposed end portion of the pn junction formed between said intermediate semiconductor layer adjacent to said one outermost semiconductor layer and said intermediate semiconductor layer adjacent to said other outermost semiconductor layer and the exposed end portion of the pn junction formed between said other semiconductor layer and said intermediate semiconductor layer adjacent to said other outermost semiconductor layer, and a channel cut electrode is kept in low-resistance contact with said highly-doped region through an opening provided in said surface-passivation insulating film, said channel cut electrode contacting with both said first and second resistive material sheets.

19. A semiconductor device according to claim 1, wherein said semiconductor substrate has a four-layer structure in which said one outermost semiconductor layer and said intermediate semiconductor layer adjacent to said one outermost semiconductor layer are exposed to said one principal surface, an intermediate semiconductor layer adjacent to said other outermost semiconductor layer is exposed to both said one and said other principal surfaces, and said other outermost semiconductor layer is exposed to said other principal surface, and wherein all of said pn junction excepting the pn junction formed between said other outermost semiconductor layer and said intermediate semiconductor layer adjacent to said other outermost semiconductor layer have the end portions exposed to said one principal surface, said second main electrode being also kept in low-resistance contact with that portion of said intermediate semiconductor layer adjacent to said other outermost semiconductor layer which is exposed to said other principal surface, said additional electrode being kept in low-resistance contact with that portion of said intermediate semiconductor layer adjacent to said other outermost semiconductor layer which is exposed to said one principal surface.

20. A semiconductor device according to claim 19, wherein said intermediate semiconductor layer adjacent to said one outermost semiconductor layer includes a highly-doped region in said principal surface, said control electrode being kept in low-resistance contact with said highly-doped region.

21. A semiconductor device according to claim 19, wherein said first main electrode extends toward said additional electrode on said resistive material sheet beyond the exposed end portion of the pn junction formed between said intermediate semiconductor layer adjacent to said one outermost semiconductor layer and said intermediate semiconductor layer adjacent to said other outermost semiconductor layer.

22. A semiconductor device according to claim 1, wherein said semiconductor substrate has a five-layer structure in which said one outermost semiconductor layer and said intermediate semiconductor layer adjacent to said one outermost semiconductor layer are exposed to said one principal surface, an intermediate semiconductor layer adjacent to said other outermost semiconductor layer is exposed to both said one and said other principal surfaces, an intermediate semiconductor layer existing between said intermediate semiconductor layer adjacent to said one outermost semiconductor layer and said intermediate semiconductor layer adjacent to said other outermost semiconductor layer is exposed to said one principal surface, and said other outermost semiconductor layer is exposed to said other principal surface, and wherein all of said pn junctions excepting the pn junction formed between said other outermost semiconductor layer and said intermediate semiconductor layer adjacent to said other outermost semiconductor layer have the end portions exposed to said one principal surface, said second main electrode being also kept in low-resistance contact with that portion of said intermediate semiconductor layer adjacent to said other outermost semiconductor layer which is exposed to said other principal surface, said additional electrode being kept in low-resistance contact with that portion of said intermediate semiconductor layer adjacent to said other outermost semiconductor layer which is exposed to said one principal surface.

23. A semiconductor device according to claim 22, wherein said intermediate semiconductor layer adjacent to said one outermost semiconductor layer includes a highly-doped region in said principal surface, said control electrode being kept in low-resistance contact with said highly-doped region.

24. A semiconductor device according to claim 22, wherein said first main electrode extends toward said additional electrode on said resistive material sheet beyond the exposed end portion of the pn junction formed between said intermediate semiconductor layer adjacent to said one outermost semiconductor layer and said intermediate semiconductor layer existing between said intermediate semiconductor layer adjacent to said one outermost semiconductor layer and said intermediate semiconductor layer adjacent to said other outermost semiconductor layer.

25. A semiconductor device according to claim 22, wherein said first main electrode is also kept in low-resistance contact with said intermediate semiconductor layer adjacent to said one outermost semiconductor layer.

26. A semiconductor device having a high breakdown voltage, comprising:

a semiconductor substrate having upper and lower principal surfaces, said substrate including at least three semiconductor layers which are adjacent to each other with alternately different conductivity types to form pn junctions therebetween, one of the outermost layers of said at least three semiconductor layers and an intermediate layer of said at least three semiconductor layers adjacent to said one outermost semiconductor layer being exposed to said upper principal surface, the other outermost semiconductor layer being exposed to both said upper and lower principal surfaces, said pn junctions having end portions exposed to said upper principal surface;

upper and lower main electrodes provided on said upper and lower principal surfaces in low-resistance contact with said one and other outermost semiconductor layers, respectively;

a control electrode provided on said upper principal surface in low-resistance contact with said intermediate semiconductor layer adjacent to said one outermost semiconductor layer;

an additional electrode provided on said upper principal surface in low-resistance contact with that portion of said other outermost semiconductor layer which is exposed to said upper principal surface;

a surface-passivation insulating film provided on said upper principal surface to cover the exposed end portions of said pn junctions for passivation thereof; and a resistive material sheet provided on said surface-passivation insulating film in contact with said upper main electrode and said additional electrode.

27. A semiconductor device having a high breakdown voltage, comprising:

a semiconductor substrate having upper and lower principal surfaces, said substrate including at least four semiconductor layers which are adjacent to each other with alternately different conductivity types to form pn junctions therebetween, one of the outermost layers of said at least four semiconductor layers and an intermediate layer of said at least four semiconductor layers adjacent to said one outermost semiconductor layer being exposed to said upper principal surface, an intermediate layer of said at least four semiconductor layers adjacent to the other outermost semiconductor layer being exposed to both said upper and lower principal surfaces, said other outermost semiconductor layer being exposed to said lower principal surface, end portions of all of said pn junctions except the pn junction formed between said other outermost semiconductor layer and said intermediate semiconductor layer adjacent to said other outermost semiconductor layer being exposed to said upper principal surface;

upper and lower main electrodes provided on said upper and lower principal surfaces in low-resistance contact with said one and other outermost semiconductor layers, respectively, said lower main electrode being also kept in low-resistance contact with that portion of said intermediate semiconductor layer adjacent to said other outermost semiconductor layer which is exposed to said lower principal surface;

a control electrode provided on said upper principal surface in low-resistance contact with said intermediate semiconductor layer adjacent to said one outermost semiconductor layer;

an additional electrode provided on said upper principal surface in low-resistance contact with that portion of said intermediate semiconductor layer adjacent to said other outermost semiconductor layer which is exposed to said upper principal surface;

a surface-passivation insulating film provided on said upper principal surface to cover the exposed end portions of said pn junctions exposed to said upper prinipal surface for passivation thereof; and a resistive material sheet provided on said surface-passivation insulating film in contact with said upper main electrode and said additional electrode.

* * * * *